United States Patent [19]

Watanabe et al.

[11] Patent Number: 5,510,666
[45] Date of Patent: Apr. 23, 1996

[54] METHOD OF DETECTING SHOCK AND SHOCK SENSOR

[75] Inventors: Naoya Watanabe; Masahiro Ota, both of Saitama, Japan

[73] Assignee: Honda Giken Kogyo Kabushiki Kaisha, Tokyo, Japan

[21] Appl. No.: 307,949

[22] Filed: Sep. 16, 1994

[51] Int. Cl.⁶ .................................................. H01L 41/08
[52] U.S. Cl. .................................................. 310/328
[58] Field of Search ................................ 310/328, 334, 310/338, 316, 317, 319

[56] References Cited

U.S. PATENT DOCUMENTS

| | | | |
|---|---|---|---|
| 3,031,591 | 4/1962 | Cary et al. | 310/328 |
| 3,150,274 | 9/1964 | Pischinger | 310/328 |
| 3,349,259 | 10/1967 | Kistler | 310/328 |
| 4,512,431 | 4/1985 | Bloomfield | 310/338 |
| 5,382,865 | 1/1995 | Butcher et al. | 310/366 |

FOREIGN PATENT DOCUMENTS

| | | | |
|---|---|---|---|
| 48-27783 | 4/1973 | Japan . | |
| 51-101563 | 9/1976 | Japan | G01B 7/02 |
| 62-291080 | 1/1987 | Japan | H01L 41/08 |
| 01-221674 | 9/1989 | Japan | G01P 15/09 |

*Primary Examiner*—Thomas M. Dougherty
*Attorney, Agent, or Firm*—Lyon & Lyon

[57] ABSTRACT

An electric field equal to at least a coercive electric field is applied to a field-excited phase transition material thereby to bring about a phase transition from an antiferroelectric phase to a ferroelectric phase for thereby causing the field-excited phase transition material to produce a distortion. Then, the electric field applied to the field-excited phase transition material is eliminated while the distortion remains in the field-excited phase transition material. Thereafter, a shock is applied to the field-excited phase transition material to forcibly remove residual distortion from the field-excited phase transition material for thereby causing the field-excited phase transition material to produce an electric signal representative of the shock. The field-excited phase transition material may comprise an electrostrictive material composed of lead, barium, niobium, zirconium, tin, titanium, and oxygen, or lead, niobium, zirconium, tin, titanium, and oxygen, or a piezoelectric/electrostrictive material.

15 Claims, 6 Drawing Sheets

$E = V/L$

METHOD OF DETECTING SHOCK AND SHOCK SENSOR

BACKGROUND OF THE INVENTION

1. Field of the Invention

The present invention relates to a method of detecting a shock and a shock sensor based on the characteristics of a field-excited phase transition material or piezoelectric/electrostrictive material for bringing about a phase transition from an antiferroelectric phase to a ferroelectric phase in response to the application of an electric field thereto.

2. Description of the Prior Art:

When a piezoelectric material is subjected to an external force, it generates a voltage proportional to the magnitude of the applied external force. A shock sensor which operates based on such piezoelectric characteristics is known from Japanese laid-open patent publication No. 1-221674, for example.

The piezoelectric device of a conventional shock sensor generates an output voltage proportional to the magnitude of an external force applied thereto even when no electric energy is supplied to the piezoelectric device. In order to detect a shock greater than a predetermined level, however, it is necessary to combine a voltage monitoring circuit with the shock sensor for generating an output shock signal when the voltage monitoring circuit detects an output voltage from the shock sensor which is higher than a predetermined reference voltage. The voltage monitoring circuit needs to be supplied with electric energy from an external source to enable the shock sensor to detect an applied shock greater than a predetermined level.

SUMMARY OF THE INVENTION

It is therefore an object of the present invention to provide a method of detecting a shock greater than a predetermined level without being supplied with electric energy from an external source.

Another object of the present invention is to provide a shock sensor capable of detecting a shock greater than a predetermined level without being supplied with electric energy from an external source.

According to the present invention, there is provided a method of detecting a shock, comprising the steps of applying an electric field equal to or greater than a coercive electric field to a field-excited phase transition material thereby to bring about a phase transition from an antiferroelectric phase to a ferroelectric phase, and thereafter applying a shock to the field-excited phase transition material to cause the field-excited phase transition material to produce an electric signal representative of the shock.

According to the present invention, there is also provided a method of detecting a shock, comprising the steps of applying an electric field equal to at least a coercive electric field to a field-excited phase transition material thereby to bring about a phase transition from an antiferroelectric phase to a ferroelectric phase for thereby causing the field-excited phase transition material to produce a distortion, eliminating the electric field applied to the field-excited phase transition material, and thereafter applying a shock to the field-excited phase transition material to forcibly remove the distortion from the field-excited phase transition material for thereby causing the field-excited phase transition material to produce an electric signal representative of the shock.

After the electric signal has been produced, an electric field equal to or greater than the coercive electric field may be applied again to the field-excited phase transition material.

According to the present invention, there is also provided a shock sensor comprising a sensor element assembly made of a field-excited phase transition material for bringing about a phase transition from an antiferroelectric phase to a ferroelectric phase in response to application of an electric field thereto, a shock transmission member mounted on the sensor element assembly for applying a shock to the sensor element assembly to eliminate a residual distortion which has been caused in the field-excited phase transition material by the phase transition, and a pair of terminals electrically connected to the sensor element for applying an electric field to the sensor element to cause the residual distortion and picking up an electric output signal which is produced by the field-excited phase transition material when the residual distortion is eliminated by the shock.

According to the present invention, there is further provided a shock sensor comprising a sensor element assembly made of a field-excited phase transition material for bringing about a phase transition from an antiferroelectric phase to a ferroelectric phase in response to application of an electric field thereto, a shock transmission member mounted on the sensor element assembly for applying a shock to the sensor element assembly to eliminate a residual distortion which has been caused in the field-excited phase transition material by the phase transition, a pair of first terminals electrically connected to the sensor element for applying an electric field to the sensor element to cause the residual distortion, and a pickup coil disposed around the sensor element assembly and having a pair of second terminals for picking up an electric output signal which is produced by the field-excited phase transition material when the residual distortion is eliminated by the shock.

The sensor element assembly may comprises a single sensor element or a plurality of stacked sensor elements.

The field-excited phase transition material may comprise an electrostrictive material composed of lead, barium, niobium, zirconium, tin, titanium, and oxygen, or lead, niobium, zirconium, tin, titanium, and oxygen, or a piezoelectric/electrostrictive material.

When an electric field equal to or in excess of the coercive electric field is applied to the field-excited phase transition material, the field-excited phase transition material brings about a phase transition which causes a distortion. The distortion remains unremoved even when the applied electric field is removed. When a shock greater than a predetermined level is applied to the field-excited phase transition material, the distortion is eliminated, and electric charges stored in the field-excited phase transition material are discharged as an electric output signal which is representative of the applied shock.

Since the field-excited phase transition material produces an electric output signal by itself upon application of a shock, no external power supply is required to be connected to the shock sensor for detecting shocks.

The field-excited phase transition material of the above compositions exhibits a large shape memory effect (charge storage effect) even when no electric energy is supplied thereto. Accordingly, the shock sensor consumes no electric energy in its operation.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
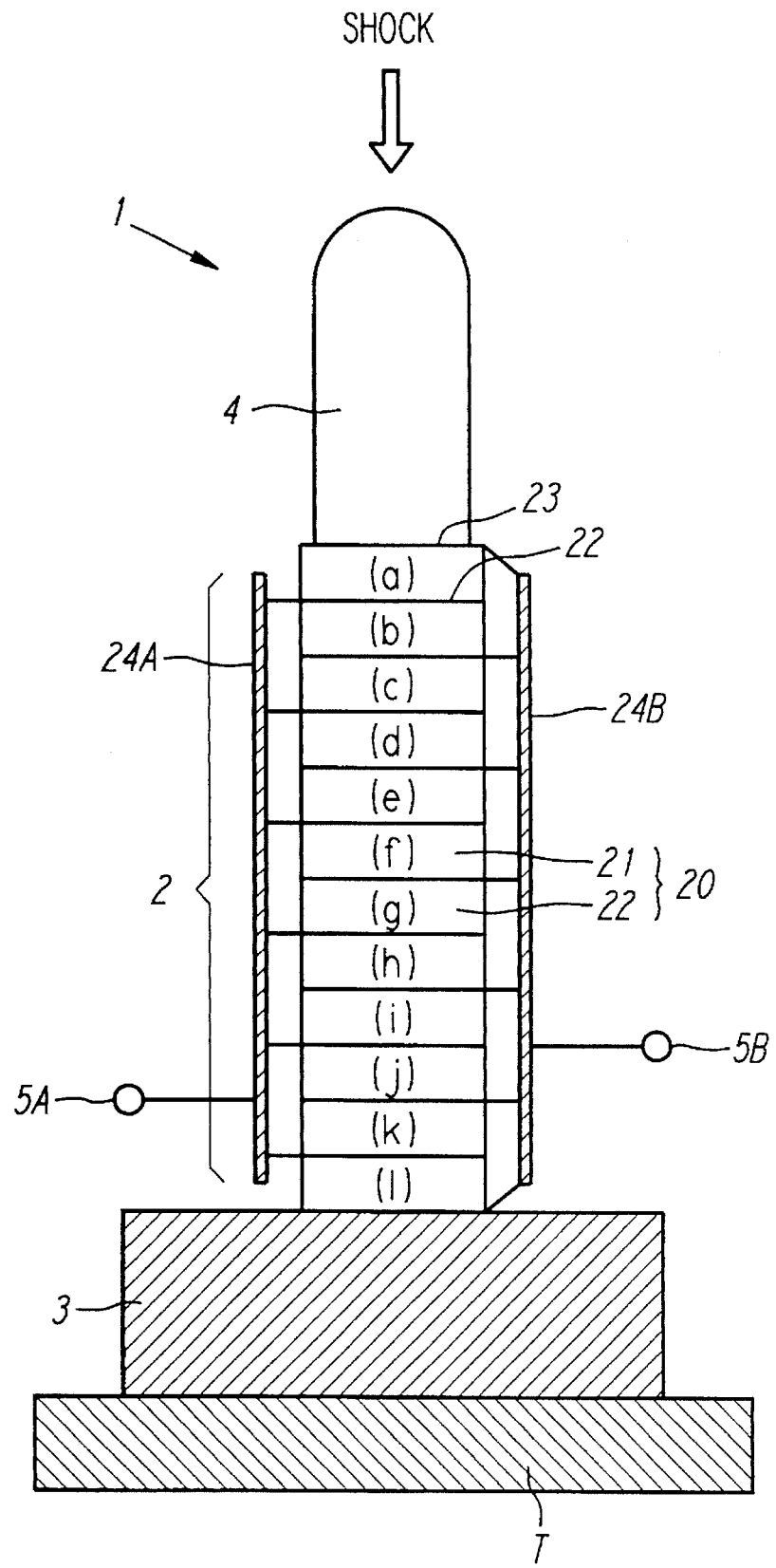
FIG. 1 is a cross-sectional view of a shock sensor according to an embodiment of the present invention.

As shown in FIG. 1, a shock sensor according to an embodiment of the present invention generally comprises a laminated sensor element assembly 2, a base 3, a shock transmission rod 4, and a pair of terminals 5A, 5B.

The laminated sensor element assembly 2 comprises a plurality of (twelve in FIG. 1) stacked sensor elements 20, indicated by (a) through (l), each comprising a sensor body 21 made of a field-excited phase transition material and an electrode 22 disposed on a surface of the sensor body 21, with an electrode 23 mounted on one end of the stack. Alternate ones of the electrodes 22, 23 of the sensor element assembly are electrically connected through external electrodes 24A, 24B to the terminals 5A, 5B, respectively. The laminated sensor element assembly 2 is mounted at its lower end remote from the electrode 23 on the base 3 which is in turn mounted on an attachment T. The shock transmission rod 4 is mounted on the electrode 23.

The laminated sensor element assembly 2 may be fabricated, for example, by stacking a plurality of green sheets or layers each made of a field-excited phase transition material as the sensor bodies 21, with respective electrodes disposed as the electrodes 22 on surfaces of the layers, respectively, thermocompressing the stack into a unitary structure, mounting an electrode as the electrode 23 on an end of the unitary structure, cutting the structure into a desired shape, and then baking the shaped structure. The laminated sensor element assembly 2 may be composed of a single sensor element with electrodes disposed on respective opposite surfaces thereof.

The field-excited phase transition material is preferably an antiferroelectric material which can change from an antiferroelectric phase to a ferroelectric phase, and may typically be an electrostrictive material such as PBNZST or PNZST composed of lead (Pb), barium (Ba), niobium (Nb), zirconium (Zr), tin (Sn), titanium (Ti), and oxygen (O). However, each of the sensor bodies 21 may be made of a composite or hybrid material which is composed of various piezoelectric and electrostrictive materials and exhibits a more piezoelectric nature or a more electrostrictive nature depending on the composition of the constituents. Such a composite or hybrid material is referred to as a "piezoelectric/electrostrictive material."

The above antiferroelectric material or electrostrictive material exhibits a shape memory effect (charge storage effect) if the composition of its ingredients is selected as follows:

$$Pb_{1-x-0.5\alpha}Ba_xNb_\alpha[(Zr_{1-\beta}Sn_\beta)_{1-y}Ti_y]_{1-\alpha}O_3 \quad (1)$$

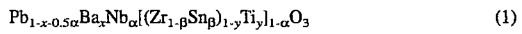

where $0.01 \leq \alpha \leq 0.03$, $0.2 \leq \beta \leq 0.6$, $0.01 \leq x$, $0.04 \leq (2x/3+y) \leq 0.075$, $0.04 \leq y \leq 0.75$.

In the above composition, niobium may be replaced with lanthanum (La).

The above antiferroelectric material or electrostrictive material also exhibits a shape memory effect if the composition of its ingredients is selected as follows:

$$Pb_{1-0.5\alpha}Nb_\alpha[(Zr_{1-\beta}Sn_\beta)_{1-y}Ti_y]_{1-\alpha}O_3 \quad (2)$$

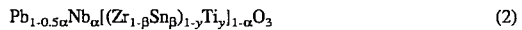

where $0.01 \leq \alpha \leq 0.03$, $0.2 \leq \beta \leq 0.37$, $0.04 \leq y \leq 0.75$.

In the above composition, niobium may also be replaced with lanthanum (La).

Figure 2A:
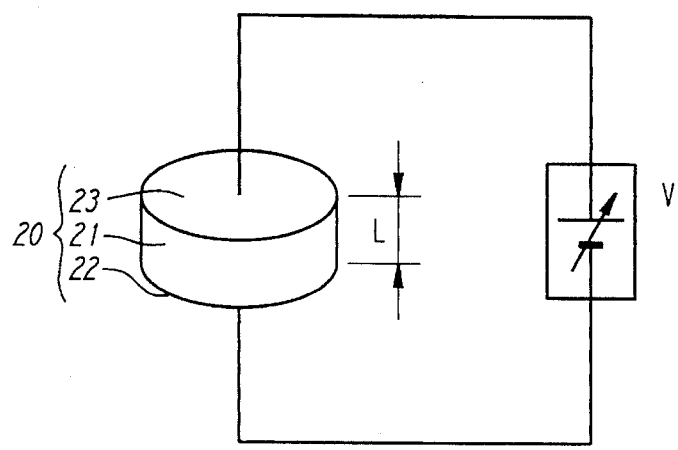
FIG. 2(a) is a perspective view of a sensor element of the shock sensor shown in FIG. 1.
Figure 2B:
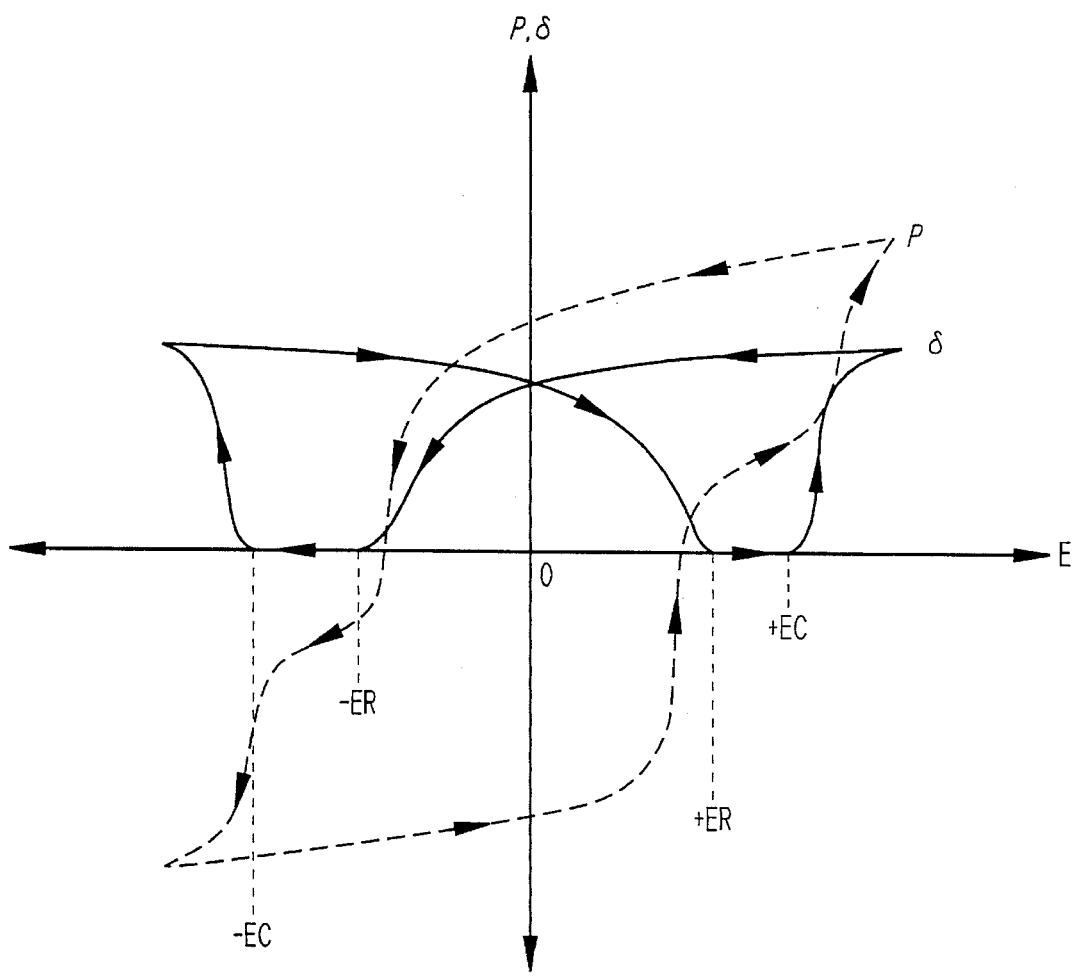
FIG. 2(b) is a diagram showing polarization and displacement characteristics of the sensor element shown in FIG. 2(a)

FIG. 2(a) shows one of the sensor elements 20 with electrodes 22, 23 mounted on opposite surfaces thereof, and FIG. 2(b) shows polarization and displacement characteristics of the sensor element 20 shown in FIG. 2(a). When an electric field E applied to the sensor element 20 by a variable voltage V which is applied between the electrodes 22, 23 ranges within an electric field ER that is smaller than a coercive electric field EC (phase transition field) as shown in FIG. 2(b), the applied electric field E and the polarization P in the sensor element 20 vary substantially linearly, and the sensor element 20 produces no distortion or displacement δ. When the electric field E applied to the sensor element 20 is equal to or exceeds the coercive electric field EC, the sensor element 20 brings about a phase transition from an antiferroelectric phase to a ferroelectric phase, and produces a large polarization P and a large distortion δ. When the applied electric field E is thereafter removed, the polarization P and the distortion δ remain unremoved. Therefore, the polarization P and the distortion δ of the sensor element 20 exhibit hysteresis. The hysteresis curve shown in FIG. 2(b) varies as the composition of the sensor bodies 21 varies.

Figure 3A:
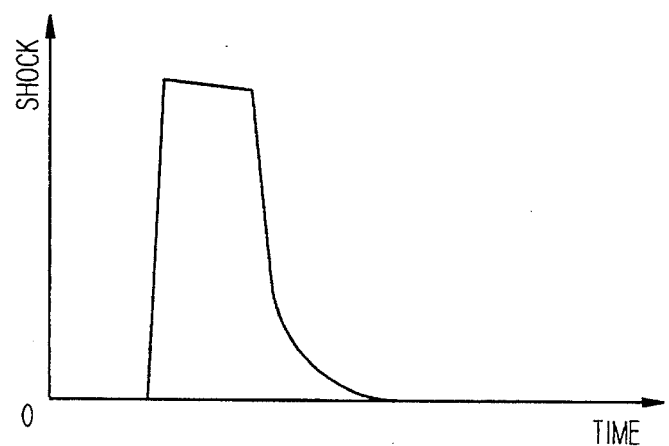
FIGS. 3(a) and 3(b) are diagrams showing, respectively, a shock applied to the shock sensor and a voltage generated by the shock sensor in response to the applied shock.
Figure 3B:
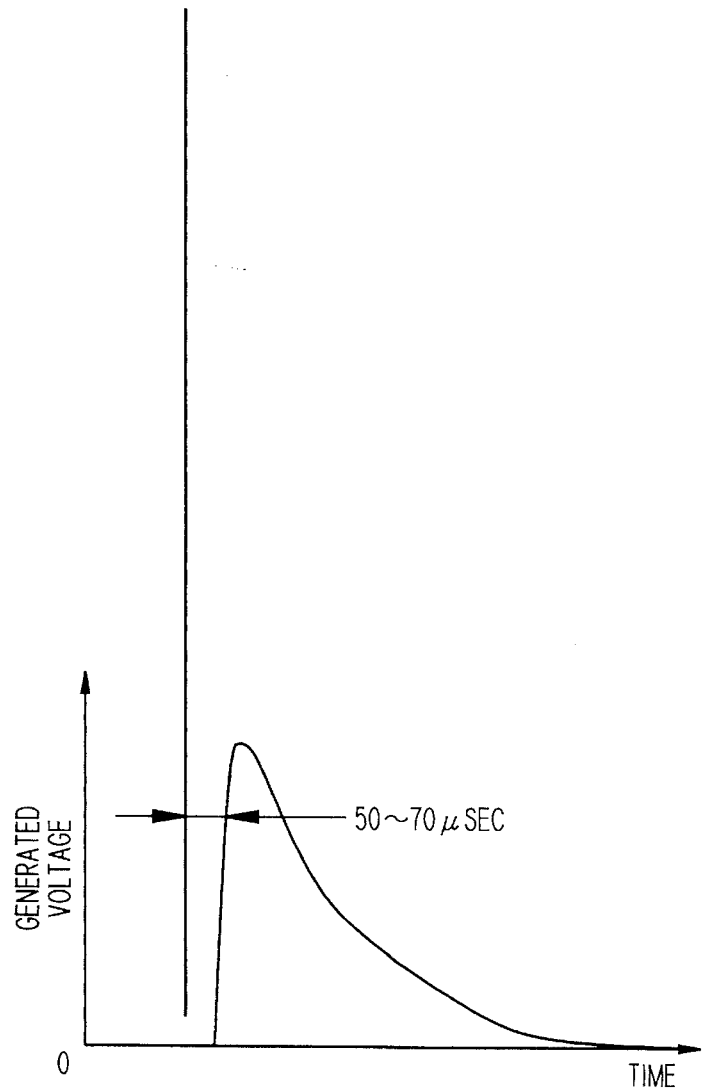

FIGS. 3(a) and 3(b), show respectively, a shock applied to the shock sensor 1 and a voltage generated by the shock sensor 1 in response to the applied shock.

A voltage is applied from an external power supply (not shown in FIG. 1) across the shock sensor 1 through the terminals 5A, 5B to apply an electric field E equal to or in excess of the coercive electric field EC to the laminated sensor element assembly 2, thereby bringing about a phase transition which produces a distortion in the laminated sensor element assembly 2. The distortion remains unremoved when the applied electric field E is eliminated. When a shock greater than a predetermined level as shown in FIG. 3(a) is thereafter applied to the shock sensor 1 through the shock transmission rod 4 in a direction to remove the residual distortion, the laminated sensor element assembly 2 returns from the phase transition to its original polarized state, and discharges electric charges which have been stored in the sensor elements 20. Now, an output voltage is generated between the terminals 5A, 5B as shown in FIG. 3(b). The shock sensor 1 has a very short response time ranging from 50 to 70 μsec., i.e., the output voltage is produced 50 to 70 μsec. after the shock has started being imposed. In addition, the output voltage rises sharply when the shock is applied.

As described above, when the laminated sensor element assembly 2 is subjected to an electric field equal to or greater than the coercive electric field, it brings about a phase transition which causes a distortion. The distortion remains unremoved even after the applied electric field is eliminated. When the residual distortion is forcibly eliminated from the laminated sensor element assembly 2 by an applied shock in excess of a predetermined level, the laminated sensor element assembly 2 generates an output voltage representing the applied shock. Consequently, the shock sensor 1 can produce an output shock signal even though no electric energy is supplied thereto.

After the shock sensor 1 has produced the output shock signal, an electric field equal to or greater than the coercive electric field may be applied to the shock sensor 1 again to enable the shock sensor 1 to detect a shock again.

Figure 4:
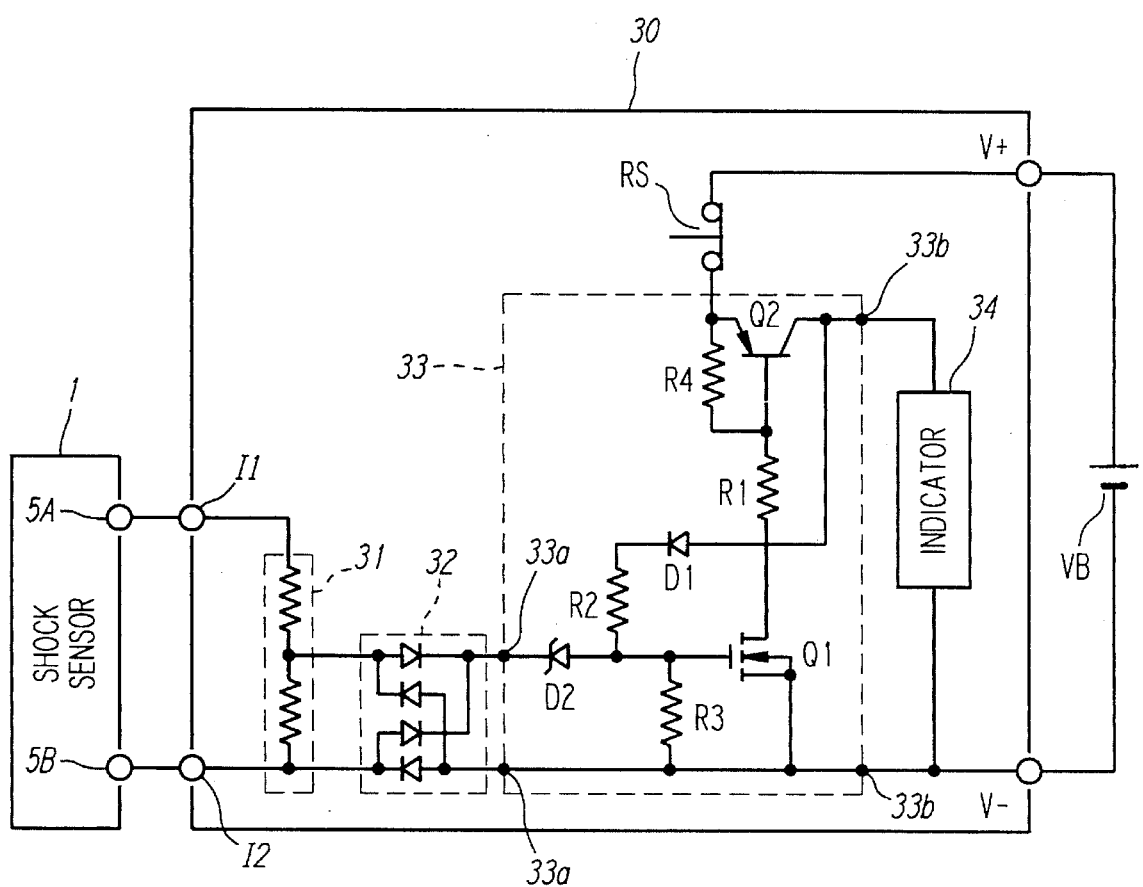
FIG. 4 is a circuit diagram, partly in block form, of an output shock signal holding device combined with the shock sensor.

FIG. 4 shows an output shock signal holding device combined with the shock sensor 1.

As shown in FIG. 4, the output shock signal holding device, generally designated by the reference numeral 30, comprises a resistive voltage divider 31 for dividing the output voltage supplied from the shock sensor 1 between input terminals I1, I2, a polarity equalizer 32 for outputting a divided voltage of constant polarity from the resistive voltage divider 31, a signal holding circuit 33 for holding the divided voltage representative of the output shock signal when the divided voltage is greater than a predetermined level, and an indicator 34 for indicating that a shock is detected by the shock sensor 1. The output shock signal holding device 30 also includes power supply terminals V+, V− connected to the positive and negative terminals, respectively, of a power supply VB. The power supply VB supplies electric energy through a normally-closed reset switch RS to the signal holding circuit 33.

The signal holding circuit 33 has an N-channel field-effect transistor Q1, which may instead be an NPN transistor, a PNP transistor Q2, a diode D1, a constant-voltage diode D2, and resistors R1~R4. When the N-channel field-effect transistor Q1 is rendered conductive by the divided voltage applied from the polarity equalizer 32 to input terminals 33a, the N-channel field-effect transistor Q1 turns on the PNP transistor Q2 through the resistor R1. A collector voltage from the PNP transistor Q2 is then applied through the diode D1 and the resistor R2 to the gate of the N-channel field-effect transistor Q1 to keep the N-channel field-effect transistor Q1 conductive. The N-channel field-effect transistor Q1 remains energized until the reset switch RS is opened to cut off the supply of the electric energy from the power supply VB. The constant-voltage diode D2 serves to increase the divided voltage which is held by the signal holding circuit 33 for thereby preventing the signal holding circuit 33 from malfunctioning due to noise, for example. The constant-voltage diode D2 may be dispensed with. The resistors R3, R4 serve as pull-down and pull-up resistors, respectively.

While the voltage signal from the polarity equalizer 32 is being held by the signal holding circuit 33, the indicator 34 is energized by the power supply VB through output terminals 33b of the signal holding circuit 33. Therefore, the indicator 34, which may comprise a visible indicator such as a lamp or an audible indicator such as a buzzer, can indicate the applied shock as detected by the shock sensor 1.

Since the output shock signal holding device 30 is triggered into an operating condition in response to the output shock signal supplied from the shock sensor 1, the output shock signal holding device 30 does not consume electric energy before the shock sensor 1 detects a shock. The polarity equalizer 32 allows the output shock signal holding device 30 to handle the output voltage from the shock sensor 1 irrespective of the polarity thereof.

When the signal holding circuit 33 is operated, a safety device (not shown) as well as the indicator 34 may be energized to control a system which incorporates the shock sensor 1 to switch into a safe condition.

Figure 5:
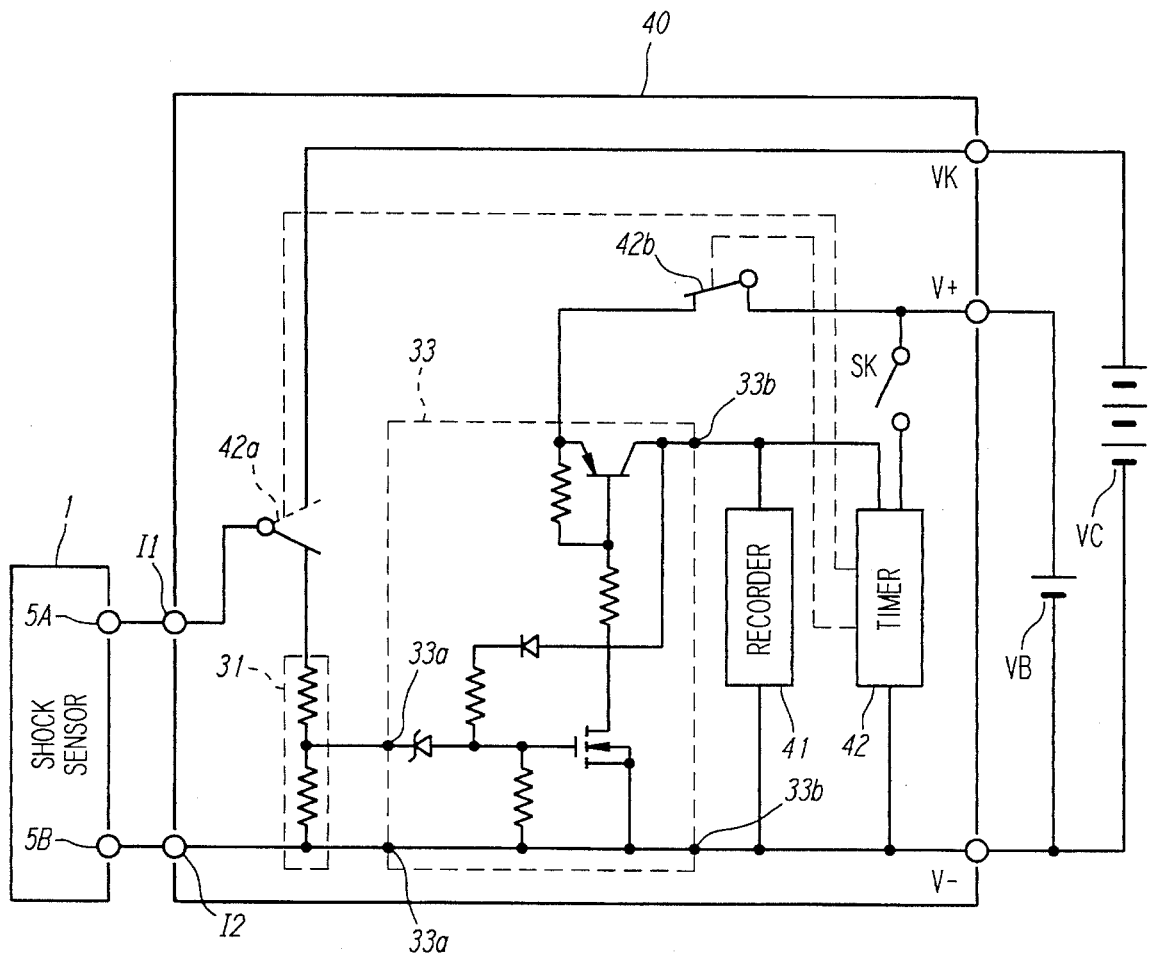
FIG. 5 is a circuit diagram, partly in block form, of an automatic shock recording device combined with the shock sensor.

FIG. 5 shows an automatic shock recording device combined with the shock sensor 1.

As shown in FIG. 5, the automatic shock recording device, generally designated by the reference numeral 40, essentially comprises a voltage divider 31, a signal holding circuit 33, a recorder 41, and a timer 42. The voltage divider 31 and the signal holding circuit 33 are identical to those shown in FIG. 4. Power supplies VB, VC are connected to the automatic shock recording device 40. The voltage divider 31 is connected to the input terminals 33a of the signal holding circuit 33. The recorder 41 and the timer 42 are connected to the output terminals 33b of the signal holding circuit 33.

The recorder 41 includes a clock circuit which is operated by a battery therein and either a recording mechanism such as a printer for printing, or a memory writer for writing in a nonvolatile memory, the time at which the electric energy is supplied from the power supply VB, i.e., a shock is detected by the shock sensor 1.

When supplied with the electric energy from the power supply VB, the timer 42 shifts a relay contact 42a for a predetermined period of time. Thereafter, upon elapse of a period of time required for the recorder 41 to record the time, the timer 42 opens a reset relay contact 42b to discontinue the supply of electric energy from the power supply VB to the signal holding circuit 33, thus disabling the signal holding circuit 33.

When a starter switch SK is closed, the electric energy is supplied from the power supply VB to the timer 42, which then shifts the relay contact 42a to the dotted-line position for thereby applying an electric field equal to or greater than the coercive electric field based on a voltage that is applied from the power supply VC through a terminal VK to the shock sensor 1.

The automatic shock recording device 40 can record successive shocks detected by the shock sensor 1 because an electric field equal to or greater than the coercive electric field is applied to the shock sensor 1 each time the shock sensor 1 produces an output shock signal, thus enabling the shock sensor 1 to detect a shock again.

Figure 6:
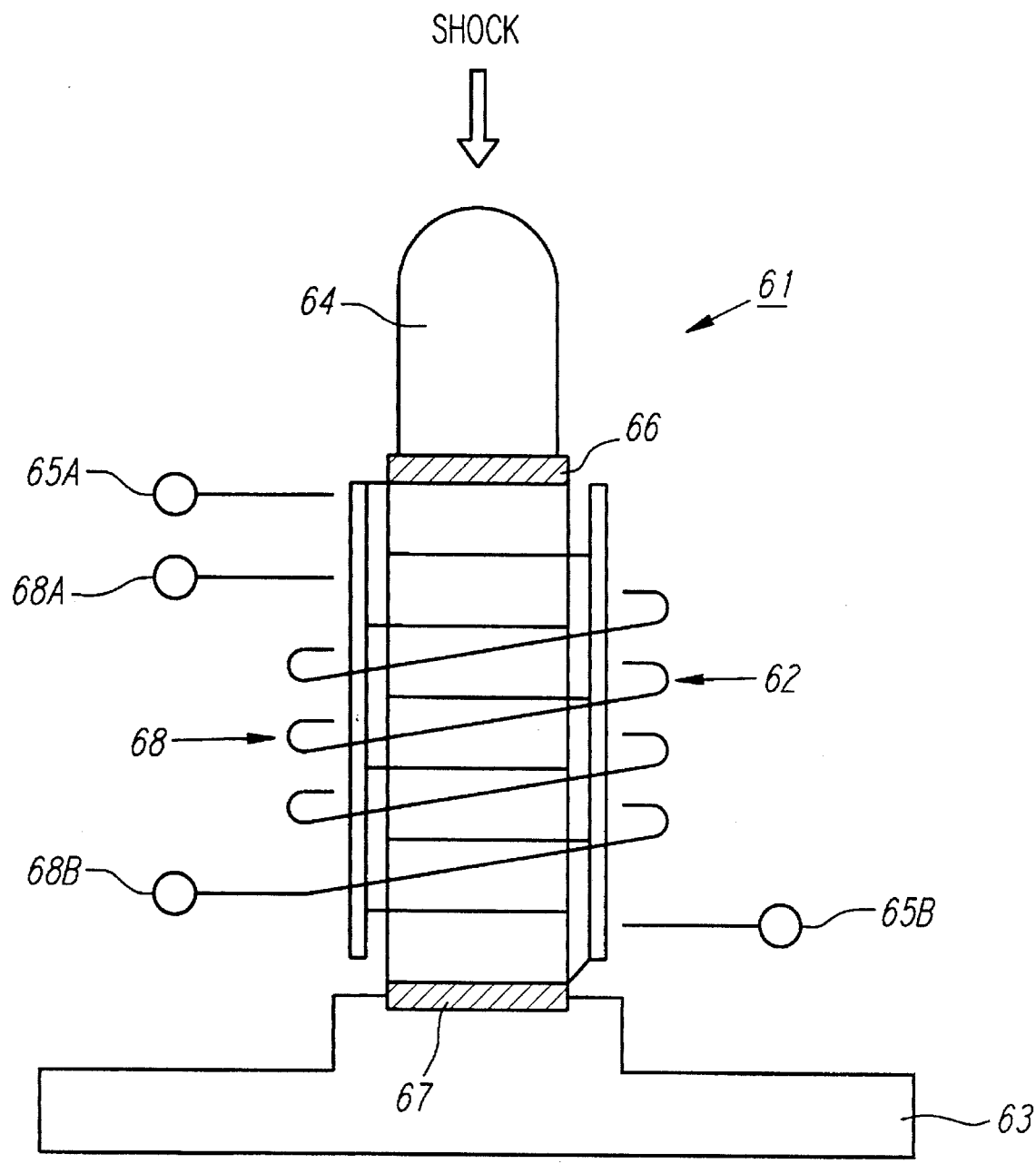
FIG. 6 is an elevational view, partly in cross section, of a shock sensor according to another embodiment of the present invention.

FIG. 6 illustrates a shock sensor 61 according to another embodiment of the present invention.

The shock sensor 61 shown in FIG. 6 has a laminated sensor element assembly 62, a pair of insulating layers 66, 67 disposed on respective opposite ends of the laminated sensor element assembly 62, a base 63 supporting the laminated sensor element assembly 62 thereon through the insulating layer 67, a shock transmission rod 64 mounted on the insulating layer 66, a pair of terminals 65A, 65B for applying an electric field equal to or greater than the coercive electric field to the laminated sensor element assembly 62, and a pickup coil 68 disposed around the laminated sensor element assembly 62 and having output terminals 68A, 68B on its opposite ends.

When a shock greater than a predetermined level is applied to the shock sensor 61, a change occurs in a current flowing through the laminated sensor element assembly 62 due to a change in the polarized state thereof. Such a current change is detected by the pickup coil 68 and outputted as an output voltage to the output terminals 68A, 68B as representing the applied shock. With the arrangement of the shock sensor 61, the terminals 65A, 65B are separate from the output terminals 68A, 68B, and a switching circuit such as shown in FIG. 5 for applying an electric field equal to or in excess of the coercive electric field is not required to be combined with the shock sensor 61. The output voltage from the pickup coil 68 may be adjusted to a desired range by varying the number of turns of the pickup coil 68.

Each of the shock sensors 1, 61 is preferably used as a shock sensor for use with an air bag system on an automobile. Specifically, the shock sensor may be mounted on a front bumper or side body panel of an automobile for detecting a shock applied thereto, and an output voltage generated by the shock sensor may be applied to inflate a bag to restrain the body of the occupant in the automobile. The air bag system which incorporates the shock sensor can operate with a quick response and does not require an electric power supply for the shock sensor. Each of the shock sensors 1, 61 may also be used to detect an allowable upper pressure limit or critical pressure for a pressure chamber or a pressure piping system.

Although certain preferred embodiments of the present invention has been shown and described in detail, it should be understood that various changes and modifications may be made therein without departing from the scope of the appended claims.

What is claimed is:

1. A method of detecting a shock, comprising the steps of:

applying an electric field equal to or greater than a coercive electric field to a field-excited phase transition material thereby to bring about a phase transition from an antiferroelectric phase to a ferroelectric phase;

maintaining a ferroelectric phase without supplying an electric field to the field-exited phase transition material; and thereafter applying a shock to the field-excited phase transition material to cause the field-excited phase transition material to produce an electric signal representative of said shock.

2. A method according to claim 1, further comprising the step of:

after the electric signal has been produced, applying again an electric field equal to or greater than the coercive electric field to said field-excited phase transition material.

3. A method of detecting a shock, comprising the steps of:

applying an electric field equal to at least a coercive electric field to a field-excited phase transition material thereby to bring about a phase transition from an antiferroelectric phase to a ferroelectric phase for thereby causing the field-excited phase transition material to produce a distortion;

eliminating the electric field applied to said field-excited phase transition material; and thereafter applying a shock to the field-excited phase transition material to forcibly remove said distortion from the field-excited phase transition material for thereby causing the field-excited phase transition material to produce an electric signal representative of said shock.

4. A method according to claim 3, further comprising the step of:

after the electric signal has been produced, applying again an electric field equal to or greater than the coercive electric field to said field-excited phase transition material.

5. A shock sensor comprising:

a sensor element assembly made of a field-excited phase transition material for bringing about a phase transition from an antiferroelectric phase to a ferroelectric phase in response to application of an electric field thereto and maintaining a ferroelectric phase without supplying an electric field to the field-excited phase transition material;

a shock transmission member mounted on said sensor element assembly for applying a shock to said sensor element assembly to eliminate a residual distortion which has been caused in said field-excited phase transition material by the phase transition; and a pair of terminals electrically connected to said sensor element for applying an electric field to said sensor element to cause said residual distortion and picking up an electric output signal which is produced by said field-excited phase transition material when said residual distortion is eliminated by said shock.

6. A shock sensor according to claim 5, wherein said sensor element assembly comprises a plurality of stacked sensor elements.

7. A shock sensor according to claim 5, wherein said field-excited phase transition material comprises a piezoelectric/electrostrictive material.

8. A shock sensor comprising:

a sensor element assembly made of a field-excited phase transition material for bringing about a phase transition from an antiferroelectric phase to a ferroelectric phase in response to application of an electric field thereto;

a shock transmission member mounted on said sensor element assembly for applying a shock to said sensor element assembly to eliminate a residual distortion which has been caused in said field-excited phase transition material by the phase transition;

a pair of first terminals electrically connected to said sensor element for applying an electric field to said sensor element to cause said residual distortion; and a pickup coil disposed around said sensor element assembly and having a pair of second terminals for picking up an electric output signal which is produced by said field-excited phase transition material when said residual distortion is eliminated by said shock.

9. A shock sensor according to claim 8, wherein said sensor element assembly comprises a plurality of stacked sensor elements.

10. A shock sensor according to claim 8, wherein said field-excited phase transition material comprises an electrostrictive material composed of lead, barium, niobium, zirconium, tin, titanium, and oxygen.

11. A shock sensor according to claim 8, wherein said field-excited phase transition material comprises an electrostrictive material composed of lead, niobium, zirconium, tin, titanium, and oxygen.

12. A shock sensor according to claim 8, wherein said field-excited phase transition material comprises a piezoelectric/electrostrictive material.

13. A shock sensor comprising:

a sensor element assembly made of a field-excited phase transition material for bringing about a phase transition from an antiferroelectric phase to a ferroelectric phase in response to application of an electric field thereto, said field-excited phase transitional material comprises an electrostrictive material composed of lead, barium, niobium, zirconium, tin, titanium, and oxygen;

a shock transmission member mounted on said sensor element assembly for applying a shock to said sensor element assembly to eliminate a residual distortion which has been caused in said field-excited phase transition material by the phase transition; and a pair of terminals electrically connected to said sensor element for applying an electric field to said sensor element to cause said residual distortion and picking up an electric output signal which is produced by said field-excited phase transition material when said residual distortion is eliminated by said shock.

14. A shock sensor comprising:

a sensor element assembly made of a field-excited phase transition material for bringing about a phase transition from an antiferroelectric phase to a ferroelectric phase in response to application of an electric field thereto, said field-excited phase transition material comprises an electrostrictive material composed of lead, niobium, zirconium, tin, titanium and oxygen;

a shock transmission member mounted on said sensor element assembly for applying a shock to said sensor element assembly to eliminate a residual distortion which has been caused in said field-excited phase transition material by the phase transition; and a pair of terminals electrically connected to said sensor element for applying an electric field to said sensor element to cause said residual distortion and picking up an electric output signal which is produced by said field-excited phase transition material when said residual distortion is eliminated by said shock.

15. A shock sensor comprising:

a sensor element assembly of a material which exhibits a shape memory effect;

at least two electrodes connected to said sensor element assembly;

an electric power supply circuit for supplying a coercive field to said sensor element assembly only for a predetermined time, thereby said sensor element assembly maintains a fixed shape without supply of electric power;

a shock transmission rod for transmitting and external force to said sensor element assembly, and a voltage detecting circuit for detecting a voltage produced by said sensor element assembly.

* * * * *